US012764966B2

(12) United States Patent
Walke et al.

(10) Patent No.: US 12,764,966 B2
(45) Date of Patent: Oct. 13, 2026

(54) FERROELECTRIC FIELD-EFFECT MEMORY DEVICE

(71) Applicant: IMEC VZW, Leuven (BE)

(72) Inventors: Amey Mahadev Walke, Heverlee (BE); Jan Van Houdt, Bekkevoort (BE)

(73) Assignee: IMEC VZW, Leuven (BE)

( * ) Notice: Subject to any disclaimer, the term of this patent is extended or adjusted under 35 U.S.C. 154(b) by 465 days.

(21) Appl. No.: 18/540,543

(22) Filed: Dec. 14, 2023

(65) Prior Publication Data

US 2024/0206186 A1 Jun. 20, 2024

(30) Foreign Application Priority Data

Dec. 15, 2022 (EP) .................................... 22213755

(51) Int. Cl.

| | |
|---|---|
| ***H10B 51/30*** | (2023.01) |
| ***H10B 51/10*** | (2023.01) |
| ***H10D 30/01*** | (2025.01) |
| ***H10D 30/69*** | (2025.01) |
| ***H10D 64/01*** | (2025.01) |
| ***H10D 64/68*** | (2025.01) |

(52) U.S. Cl.

CPC ............. *H10B 51/30* (2023.02); *H10B 51/10* (2023.02); *H10D 30/0415* (2025.01); *H10D 30/701* (2025.01); *H10D 64/033* (2025.01); *H10D 64/689* (2025.01)

(58) Field of Classification Search

None

See application file for complete search history.

(56) References Cited

U.S. PATENT DOCUMENTS 12,446,266 B1 * 10/2025 Tan .................... H10D 30/0415
2022/0246766 A1 8/2022 Manfrini et al.

FOREIGN PATENT DOCUMENTS

KR 10-2247029 B1 4/2021
KR 10-2022-0005814 A 1/2022

(Continued)

OTHER PUBLICATIONS

Extended European Search Report dated May 19, 2023 in European Application No. 22213755.6, in 9 pages.

(Continued)

*Primary Examiner* — Nicholas J Tobergte

(74) *Attorney, Agent, or Firm* — Knobbe, Martens, Olson & Bear, LLP

(57) ABSTRACT

The disclosed technology relates to a ferroelectric field-effect transistor (FeFET) memory structure. The FeFET memory structure can include a substrate, including an insulator layer; a gate metal layer on the insulator layer; at least one ferroelectric material layer on the gate metal layer; and a layer structure comprising at least one wide bandgap semiconductor layer on the ferroelectric material layer, wherein the layer structure can include: a first section having a first height, and at least one second section having a second height that is smaller than the first height. The FeFET memory structure can further include a drain metal structure which is arranged on the first section of the layer structure, and one or more source metal structures, wherein each source metal structure is arranged on a respective second section of the layer structure.

21 Claims, 14 Drawing Sheets

(56) References Cited

FOREIGN PATENT DOCUMENTS

| | | | |
|---|---|---|---|
| KR | 10-2022-0005815 | A | 1/2022 |
| WO | WO 2021/155557 | A1 | 8/2021 |
| WO | WO 2022/154248 | A1 | 7/2022 |

OTHER PUBLICATIONS

Mo et al., "Experimental Demonstration of Ferroelectric HfO2 FET with Ultrathin-body IGZO for High-Density and Low-Power Memory Application", 2019 Symposium on VLSI Technology, Kyoto, Japan, 2019, pp. T42-T43.
Mo et al., "Low-Voltage Operating Ferroelectric FET with Ultrathin IGZO Channel for High-Density Memory Application", IEEE Journal of the Electron Devices Society, vol. 8, pp. 717-723, 2020.
Sharma et al., "High Speed Memory Operation in Channel-Last, Back-gated Ferroelectric Transistors", 2020 IEEE International Electron Devices Meeting (IEDM), San Francisco, CA, USA, 2020, pp. 18.5.1-18.5.4.

* cited by examiner

FERROELECTRIC FIELD-EFFECT MEMORY DEVICE

CROSS-REFERENCE TO RELATED APPLICATIONS

This application claims foreign priority to European Application No. 22213755.6, filed Dec. 15, 2022, which is incorporated by reference herein in its entirety.

BACKGROUND

Field

The disclosed technology relates generally to a ferroelectric field-effect transistor (FeFET) memory structure and, more particularly, to a memory device including the FeFET memory structure and a method of fabricating the FeFET memory structure.

Description of the Related Technology

A ferroelectric field-effect transistor (FeFET) is a field-effect transistor that incorporates a ferroelectric material as its gate dielectric. The FeFETs can be used in memory devices. For example, data can be stored in the form of a threshold voltage of the FET, which depends on the net ferroelectric polarization (up or down) charge of the ferroelectric material.

The FeFETs can also be used for non-volatile memories (NVM). These memories with the FeFETs can be faster and more energy efficient than conventional flash memories. Some FeFETs can offer faster read/write operations of ca. 10-1000 ns, compared to ca. 100 μs in conventional flash memories, and require lower program/erase voltages, which enables operation with lower energy consumption.

A conventional FeFET is shown in FIG. 1. The FeFET is top gated, such that the gate contact can be arranged on top of a ferroelectric layer, as shown in FIG. 1. This conventional FeFET can cause a formation of an interfacial layer (e.g., $SiO_2$, as shown in FIG. 1) between the channel and the ferroelectric material (e.g., below the ferroelectric layer in FIG. 1). The interfacial layer is typically formed as a consequence of scavenging of oxygen by the Si channel from the oxide ferroelectric material. The presence of this interfacial layer may lead to higher voltages being necessary for programming. Additionally, it can cause a band alignment (e.g., favorable band alignment) that facilitates charge trapping within the ferroelectric layer. This could diminish the memory window's performance, thereby adversely affecting both the endurance and retention characteristics of the device.

SUMMARY OF CERTAIN INVENTIVE ASPECTS

In view of the above, an objective of the disclosed technology is to provide an improved FeFET memory structure and an improved method of fabricating the FeFET memory structure. In some examples, the disclosed technology can resolve the above-mentioned deficiencies.

These objectives are achieved by the solutions of disclosed technology described in the independent claims. Advantageous implementations are described in the dependent claims.

A first aspect of the disclosed technology is a ferroelectric field-effect transistor (FeFET) memory structure, including a substrate that can include an insulator layer; a gate metal layer on the insulator layer; at least one ferroelectric material layer on the gate metal layer; a layer structure that includes at least one wide bandgap semiconductor layer on the ferroelectric material layer. The layer structure can include: a first section having a first height, and at least one second section having a second height that is smaller than the first height. The FeFET memory structure can further include a drain metal structure which is arranged on the first section of the layer structure; and one or more source metal structures. Each source metal structure can be arranged on a respective second section of the layer structure.

This achieves the advantage that the FeFET memory structure can be provided which requires lower voltages during reading/writing operations and operates with enhanced speed.

In some examples, the ferroelectric material layer of the memory structure can store information by its two net ferroelectric polarization states (up and down). Thereby, the sections of the ferroelectric material layer under each source structure can be individually programmed/read-out. This reading/writing is performed by applying appropriate voltages to the source, the gate and the drain contacts. The ferroelectric polarization state of the ferroelectric material layer (under each source) can determine the local conductive state of the wide bandgap semiconductor layer and its contact resistance to the above source metal structure.

The reduced thickness of the layer structure in the second section below the source metal structure(s) are advantageous. For example, the thinner channel (e.g., the layer structure below the source) can ensure a higher modulation of the conductivity of the channel (depending on the ferroelectric polarization) which causes a higher modulation in the contact resistance with the source contact. Thus, facilitating the read-out of the memory state. Further, the reduced thickness can reduce the programming voltage requirements of the ferroelectric material layer. Apart from the region below the source, the thickness of the layer structure can be increased (e.g., between adjacent sources or under the drain). This enhanced thickness can reduce the sheet resistance of the wide bandgap semiconductor layer for horizontal currents (e.g., currents to and from the drain structure), which can enhance the speed of operation of the memory.

In some examples, the wide bandgap semiconductor layer has a bandgap larger than Si. For instance, the wide bandgap semiconductor layer can be an oxide semiconductor layer (e.g., IGZO). Such oxide based semiconductor materials do not form an additional interfacial layer (e.g., a $SiO_2$ layer). Thus, the programming voltage does not have to be increased to compensate for this interfacial layer. Furthermore, a less favorable band alignment for charge trapping can be achieved. This can prevent the drifting of the threshold voltage and, thus, improves the endurance of the device. Furthermore, the reduced charge trapping can also reduce a delay in reading after writing data operation in the memory.

The source and drain metal structures can include identical or different metals. The drain metal can form an ohmic contact with the first section of the layer structure, while the source metal can form a Schottky contact with the second section of the layer structure. The insulator layer can insulate the memory device.

In some embodiments, the first section of the layer structure has a height between 10 and 30 nm and, in some examples, between 15 and 25 nm. This can achieve the advantage of an enhanced sheet resistance of the wide bandgap semiconductor layer for horizontal currents which can increase the speed of operation of the memory device.

In some embodiments, at least one second section of the layer structure can have a height between 2 and 8 nm and, in some examples, between 3 and 5 nm. In some examples, this reduced layer thickness below the source contacts can cause a strong modulation in the contact resistance between the wide bandgap semiconductor layer and the source metal structures, depending on the net polarization state of the ferroelectric. For example, the difference between the contact resistance between the polarizations "up" and "down" can be enhanced.

In the following, various compounds and materials are disclosed without reference to their stoichiometry. However, it will be understood that such compounds and materials encompass stoichiometric and off-stoichimetry compositions, unless specified otherwise. For example, "PbZrTiO" will be understood to include $Pb(Zr_xTi_{1-x})O_3$, where $0 \leq x \leq 1$.

In some embodiments, the layer structure can include at least one layer of any one of the following materials: indium gallium zinc oxide (IGZO) indium tin oxide (ITO), indium zinc oxide (IZO), tungsten oxide (WO), zinc oxide (ZnO), indium oxide (InO), tin oxide (SnO), magnesium zinc oxide (MgZnO), Mg- and Al-doped ZnO (MgAlZnO), or gallium zinc oxide (GaZnO).

The layer structure can be a multilayer stack, which can include layers of different materials and conductivities. A bottom layer of the stack (which also covers the area under the source contacts) can have a lower conductivity than the top layer(s). In some examples, the layer stack can be a bilayer stack.

In some embodiments, the ferroelectric material layer can include any one of the following materials: doped or undoped hafnium-zirconium oxide (HZO), for example, lanthanum doped HZO (La:HZO), doped hafnium oxides, complex oxides from the perovskite family, in some examples SrBiTaO (sometimes referred to as "SBT"), PbZrTiO (sometimes referred to as "PZT"), BiFeO (sometimes referred to as "BFO"), or an alloy or mixture of BiTiO and BaTiO (sometimes referred to as "BTO-BaTiO"), or other ferroelectrics, such as those having a wurtzite structure, such as AlScN or MgZnO.

In some embodiments, the gate metal layer can include any one of the following materials: titanium nitride (TiN), tungsten (W), aluminum (Al), molybdenum (Mo), doped polycrystalline silicon (poly-Si), doped germanium (Ge), platinum (Pt), or ruthenium (Ru).

In some embodiments, the layer structure can include a plurality of second sections which are separated from each other and which are arranged along a line. A respective source metal structure can be arranged on each of the plurality of second sections.

In some embodiments, the FeFET memory structure can further include a gate contact structure arranged on the gate metal layer. The gate contact structure can be configured to apply a voltage to the gate metal layer.

A second aspect of the disclosed technology relates to a memory device, including a plurality of FeFET memory structures according to the first aspect of the disclosed technology and one or more bit line structures on the FeFET memory structures. Each bit line structure can be in contact with one source metal structure of each of the plurality of FeFET memory structures. Each bit line structure can be configured to apply a voltage to the source metal structures with which it is in contact.

The gate metal layer of each FeFET memory structure can form the respective word line structures of the memory device. The gate metal layers (e.g., word lines) and bit line structures can be arranged perpendicular to each other, forming a crossbar array. Thus, the memory device can be a memory array device.

In some examples, the bit line structures can be arranged on the FeFET memory structures.

A third aspect of the disclosed technology is a method of fabricating a ferroelectric field-effect transistor (FeFET) memory structure. The method can include the steps of: forming a gate metal layer on a substrate that the substrate can include an insulating layer; forming at least one ferroelectric material layer on the gate metal layer; forming a layer structure that can include at least one wide bandgap semiconductor layer on the ferroelectric material layer, where the layer structure can include: a first section having a first height, and at least one second section having a second height that is smaller than the first height. The method can further include: forming a drain metal structure which is arranged on the first section of the layer structure; and forming one or more source metal structures. Each source metal structure can be arranged on a respective second section of the layer structure.

In some examples, the method according to the third aspect of the disclosed technology can be used to fabricate the FeFET memory structure according to the first aspect of the disclosed technology.

In some embodiments, the step of forming the layer structure can include: forming the at least one wide bandgap semiconductor layer on the ferroelectric material layer with a uniform height, the uniform height being the first height; and locally reducing the uniform height of the at least one wide bandgap semiconductor layer to the second height to form the at least one second section.

In some embodiments, the first section of the layer structure can have a height between 10 and 30 nm, for example, between 15 and 25 nm.

In some embodiments, at least one second section of the layer structure has a height between 2 and 8 nm, for example, between 3 and 5 nm.

In some embodiments, the gate metal layer can be removed in a region below the drain metal structure prior to forming the at least one ferroelectric material layer.

In some embodiments, the method can further include: forming a gate contact structure on the gate metal layer. The gate contact structure can pass through a gap in the at least one ferroelectric material layer.

The above description with regard to the FeFET memory structure according to the first aspect of the disclosed technology is correspondingly valid for the method according to the third aspect of the disclosed technology.

BRIEF DESCRIPTION OF THE DRAWINGS

The above described aspects and implementations are explained in the following description of embodiments with respect to the enclosed drawings.

DETAILED DESCRIPTION OF CERTAIN ILLUSTRATIVE EMBODIMENTS

Figure 1:
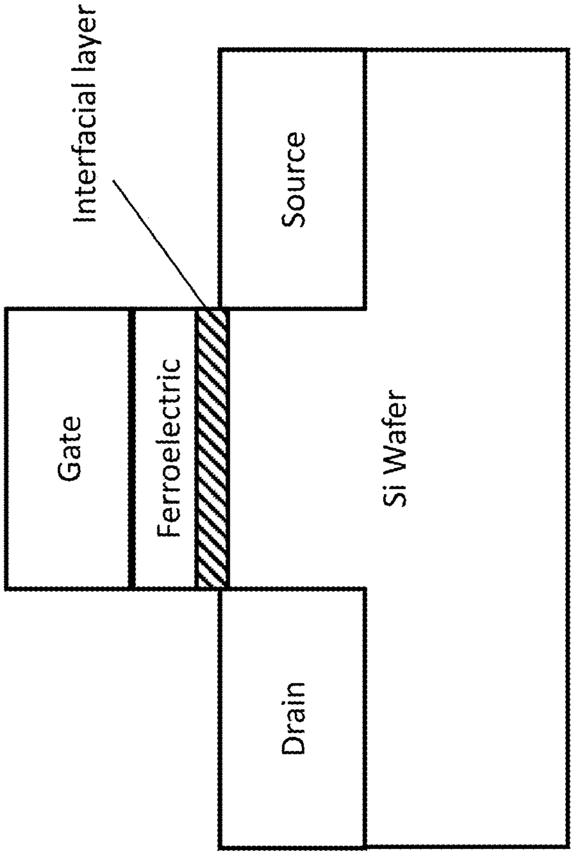
FIG. 1 shows a FeFET according to a conventional example.

As described in the above, a conventional FeFET is shown in FIG. 1. The FeFET is top gated, such that the gate contact can be arranged on top of a ferroelectric layer, as shown in FIG. 1. This conventional FeFET can cause a formation of an interfacial layer (e.g., $SiO_2$, as shown in FIG. 1) between the channel and the ferroelectric material (e.g., below the ferroelectric layer in FIG. 1). The interfacial layer is typically formed as a consequence of scavenging of oxygen by the Si channel from the oxide ferroelectric material. The presence of this interfacial layer may lead to higher voltages being necessary for programming. Additionally, it can cause a band alignment (e.g., favorable band alignment) that facilitates charge trapping within the ferroelectric layer. This could diminish the memory window's performance, thereby adversely affecting both the endurance and retention characteristics of the device.

Figure 2:
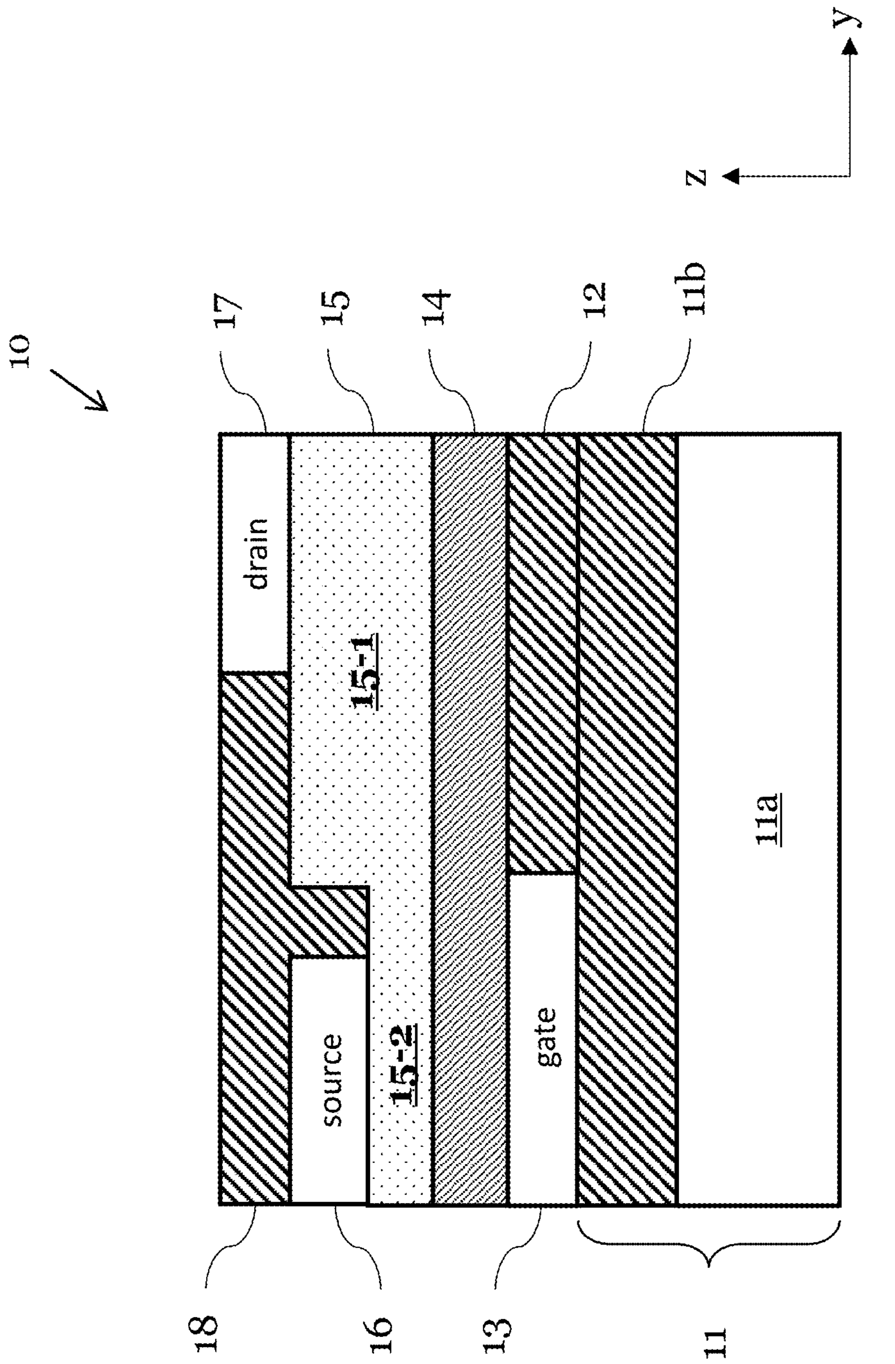
FIG. 2 shows a schematic diagram of a FeFET memory structure according to one or more embodiments of the disclosed technology.

FIG. 2 shows a schematic diagram of a FeFET memory structure 10 according to one or more embodiments of the disclosed technology. More specifically, FIG. 2 shows a cross-sectional view of the FeFET memory structure 10 across a y-z plane.

The FeFET memory structure 10 can include a substrate 11 which can include an insulator layer 11*b*. The FeFET memory structure 10 further can include a gate metal layer 13 on the insulator layer 11*b*, at least one ferroelectric material layer 14 on the gate metal layer 13, and a layer structure 15. The layer structure 15 can also include at least one wide bandgap semiconductor layer. The layer structure 15 can be arranged on the ferroelectric material layer 14 and can include a first section 15-1 having a first height and at least one second section 15-2 having a second height that is smaller than the first height. The FeFET memory structure 10 further can include a drain metal structure 17 which can be arranged on the first section 15-1 of the layer structure 15, and one or more source metal structures 16. In some examples, each source metal structure 16 can be arranged on a respective second section 15-2 of the layer structure 15.

The ferroelectric material layer 14 can be configured to store information by its two net polarization states. Thereby, the sections of the ferroelectric material layer 14 under each source structure 16 can be individually programmed/read-out.

For instance, the ferroelectric material layer 14 may include any one of the following materials: doped or undoped hafnium-zirconium oxide (HZO), in some examples, lanthanum doped HZO (La:HZO), doped hafnium oxides, complex oxides from the perovskite family, such as SrBiTaO (SBT), PbZrTiO (PZT), BiFeO (BFO), or BTO-BaTiO, or other ferroelectrics, such as those having a wurtzite structure, for example, AlScN or MgZnO.

The layer structure 15 on the ferroelectric material layer 14 can include one or more wide bandgap semiconductor layers. In some examples, each wide bandgap semiconductor layer has a bandgap larger than Si. For instance, the wide bandgap semiconductor layers can be oxide semiconductor layers (e.g., IGZO). Such oxide based semiconductor materials do not form an additional interfacial layer (e.g., a $SiO_2$ layer) between the channel and the ferroelectric material layer 14. Thus, the programming voltage may not have to be increased to compensate for this interface layer. Furthermore, a less favorable band alignment for charge trapping can be achieved. This can prevent the drifting of the threshold voltage and thus lead to improved endurance.

In some examples, the memory structure 10 can be a back gated FeFET, where the gate can be located under the source metal contact(s) 16. The layer structure 15 or parts thereof can form a channel of the FeFET memory structure 10.

The wide bandgap semiconductor material layer(s) of the layer structure 15 can include or be formed from any one of the following materials: indium gallium zinc oxide (IGZO) indium tin oxide (ITO), indium zinc oxide (IZO), tungsten oxide (WO), zinc oxide (ZnO), indium oxide (InO), tin oxide (SnO), magnesium zinc oxide (MgZnO), Mg- and Al-doped ZnO (MgAlZnO), or gallium zinc oxide (GaZnO).

In some examples, the polarization (e.g., net polarization) state of the ferroelectric material layer (under each source metal structure 16) determines the local conductive state of the wide bandgap semiconductor layer(s) and its contact resistance to the above source metal structure 16, which can be utilized to read-out the ferroelectric polarization and, thus, memory state.

For instance, the height of the first section 15-1 of the layer structure 15 (e.g., the first height) is between 10 and 30 nm, in some examples, between 15 and 25 nm, and the height of the at least one second section 15-2 of the layer structure 15-2 (e.g., the second height) is between 2 and 8 nm, in some examples, between 3 and 5 nm.

In some examples, the ferroelectric material layer 14 has a bigger thickness than the layer structure 15. In some examples, the ferroelectric material layer 14 has a bigger thickness than the second section 15-2 of the layer structure 15. This can ensure a stronger potential drop across the ferroelectric material layer 15.

In some examples, the reduced thickness of the layer structure 15 below the source metal structure(s) 16 increases the modulation of the conductivity of the channel. The higher conductivity modulation can ensure a higher modulation in the contact resistance between the layer structure 15 and the source metal structure 16 which can be used to measure the polarization state of the ferroelectric. Furthermore, the reduced thickness can reduce programming voltage requirements of the ferroelectric material layer.

The increased thickness of the layer structure 15 in the first section 15-1 can reduce the sheet resistance of the wide bandgap semiconductor layer(s) for horizontal currents (e.g., current to and from the drain metal structure 17).

The insulator layer 11*b*, in some examples, can insulate the memory structure 10. The insulator layer 11*b* can be an oxide. The substrate 11 may further include a base substrate 11*a*, such as a silicon wafer or a part thereof. In some examples, the insulator layer 11*b* is arranged on the base substrate 11*a*.

The memory structure 10 may include a further oxide layer 12 which can be arranged on the insulator layer 11*b* in regions that are not covered by the gate metal layer 13, in some examples under the first section of the layer structure 15. An additional oxide layer 18 or other isolating layer can be arranged above the layer structure 15.

The layer structure 15 can be a single layer which is structured to have the first section 15-1 with the first height and the second section 15-2 with the second height.

Figure 3:
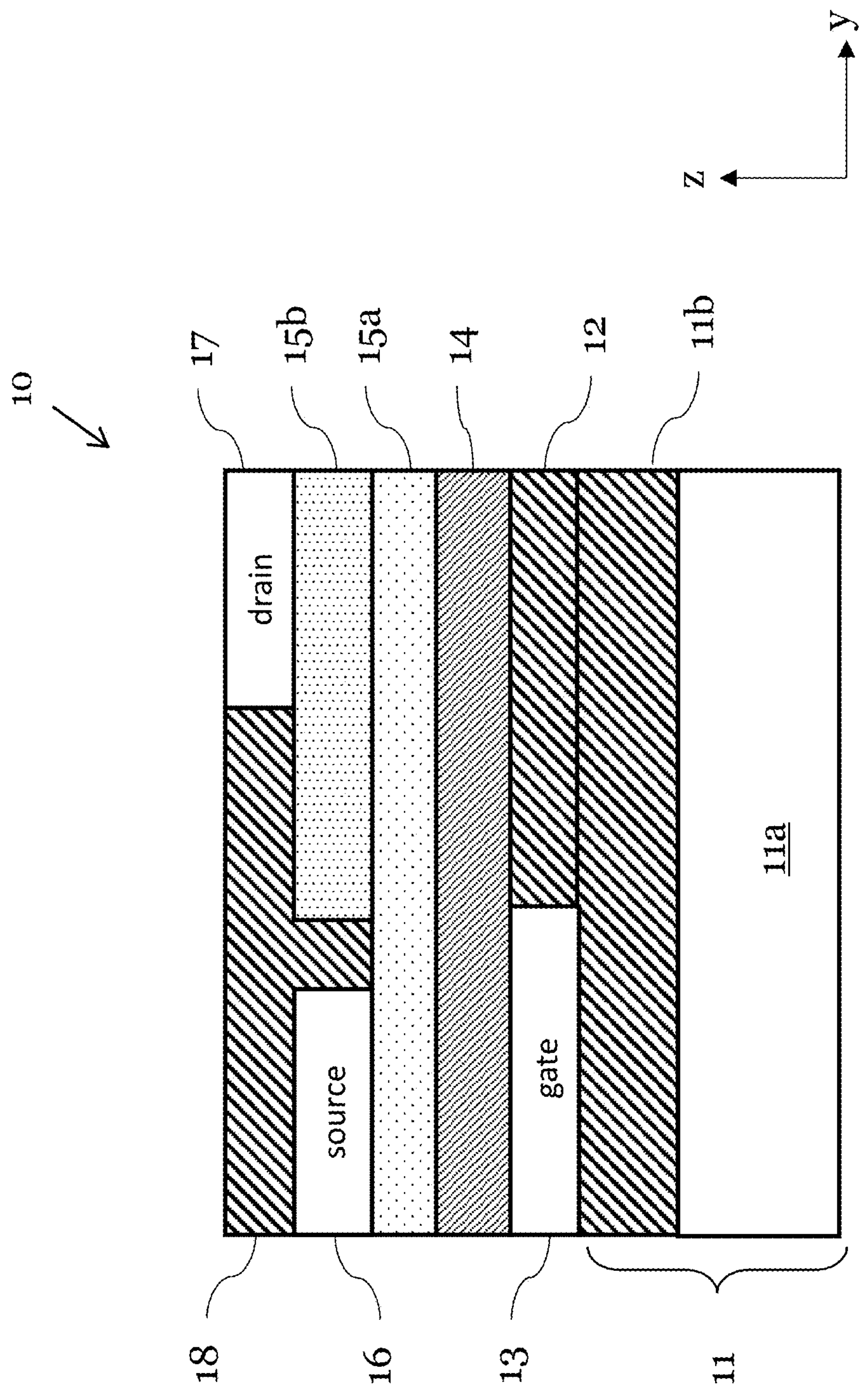
FIG. 3 shows a schematic diagram of a FeFET memory structure according to one or more embodiments of the disclosed technology.

In some embodiments, as shown in FIG. 3, the layer structure can be a multilayer stack, e.g. a bilayer stack. In these embodiments, the layer structure 15 can include a bottom layer 15*a* which has the second height, and at least one further layer 15*b* on the bottom layer. The further layer 15*b* can partially cover the bottom layer 15*a* and form the second sections 15-2 of the layer stack 15. The combined thickness of the bottom layer 15*a* and the further layer 15*b* can thereby correspond to the second height.

For instance, the source metal structure 16 can contact the bottom layer 15*a* which has a lower conductivity to ensure a higher modulation of its conductivity as a function of the ferroelectric polarization. The further layer 15*b* on the top which is in contact with the drain metal structure 17 can have a higher conductivity to ensure that the sheet resistance of the further layer 15*b*, and the contact resistance to the drain metal structure 17 is lower.

The source and drain metal structures 16, 17, respectively, can include identical or different metals. For instance, the drain metal structure 17 can form an ohmic contact with the layer structure 15, while the source metal structure 16 can form a Schottky contact with the layer structure 15

The gate metal layer 13 can include any one of the following materials: titanium nitride (TiN), tungsten (W), aluminum (Al), molybdenum (Mo), doped polycrystalline silicon (poly-Si), doped germanium (Ge), platinum (Pt), or ruthenium (Ru).

In some examples, the gate metal layer forms a word line structure and the source metal structures 16 are connected to a bit line (not shown in FIGS. 2 and 3).

The layer structure 15 may include a plurality of second sections which are separated from each other, and which are arranged along a line. A respective source metal structure 16 can be arranged on each of the plurality of second sections.

Programming of the memory structure 10 can be performed by applying a positive respectively negative bias between the gate and source metal structures 13, 16 (MFSM capacitor). The drain metal structure 17 can be used to pump current through the bit line while reading the memory state.

In some examples, after programming, the net programmed polarization state of the ferroelectric material layer 14 influences both the channel (e.g., the section of the layer structure 15 under the source) as well as the source contact resistance thereby regulating the magnitude of the current flowing through the source metal structure 16 to the bit line. For instance, if the channel is in depletion, the contact resistance between source metal structure 16 and layer structure 15 will be higher and a lower current flows though the source metal structure 16 to the bit line. If the channel is in accumulation, the contact resistance between source metal structure 16 and layer structure 15 will be lower and a higher current flows though the source metal structure 16 to the bit line.

Figure 4:
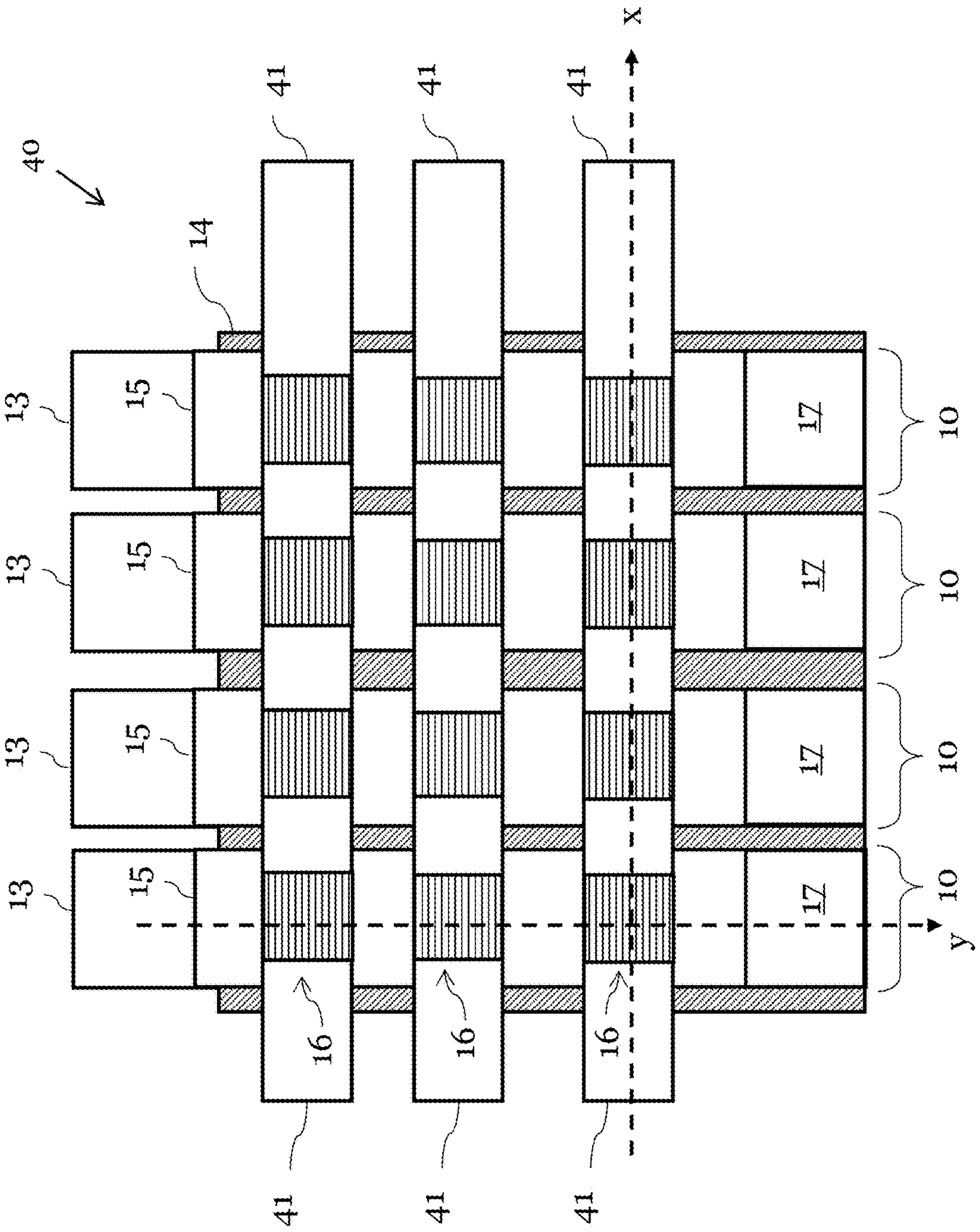
FIG. 4 shows a top view of a memory device according to one or more embodiments of the disclosed technology.

FIG. 4 shows a top view of a memory device 40, in some examples, a memory array device, according to one or more embodiments of the disclosed technology.

The memory device 40 can include a plurality of FeFET memory structures 10, such as shown in FIG. 2 or 3. The memory device 40 further can include one or more bit line structures 41. Each bit line structure 41 can be in contact with one source metal structure 16 of each of the plurality of FeFET memory structures 10. Furthermore, each bit line structure 41 can be configured to apply a voltage to the source metal structures 16 to which it is in contact.

The memory device 40 can include a cross bar array. The FeFET memory structures 10 can be arranged in vertical columns, and the bit line structures 41 can be arranged in horizontal rows. Thus, the memory device 40 can be a memory array device. Each memory structures 10 (e.g., in the example depicted in FIG. 4) can include three source metal structures 16 which are arranged along a line and which are in contact with a respective bit line structure 41. Thereby, the gate metal layer 13 of each memory structure 10 can form a respective word line. Each word line can include a separate drain metal contact 17 which is connected to the layer structure 15 (e.g., an IGZO layer). Below the source metal structures 16, the layer structure 15 has the (reduced) second height. In some examples, in the regions between the individual source metal structures 16, the layer structure 15 has the first height.

The bit line structures 41 can be connected to one or more sense amplifiers. In some examples, the memory device 40 can be operated with a unipolar power supply.

Figure 5:
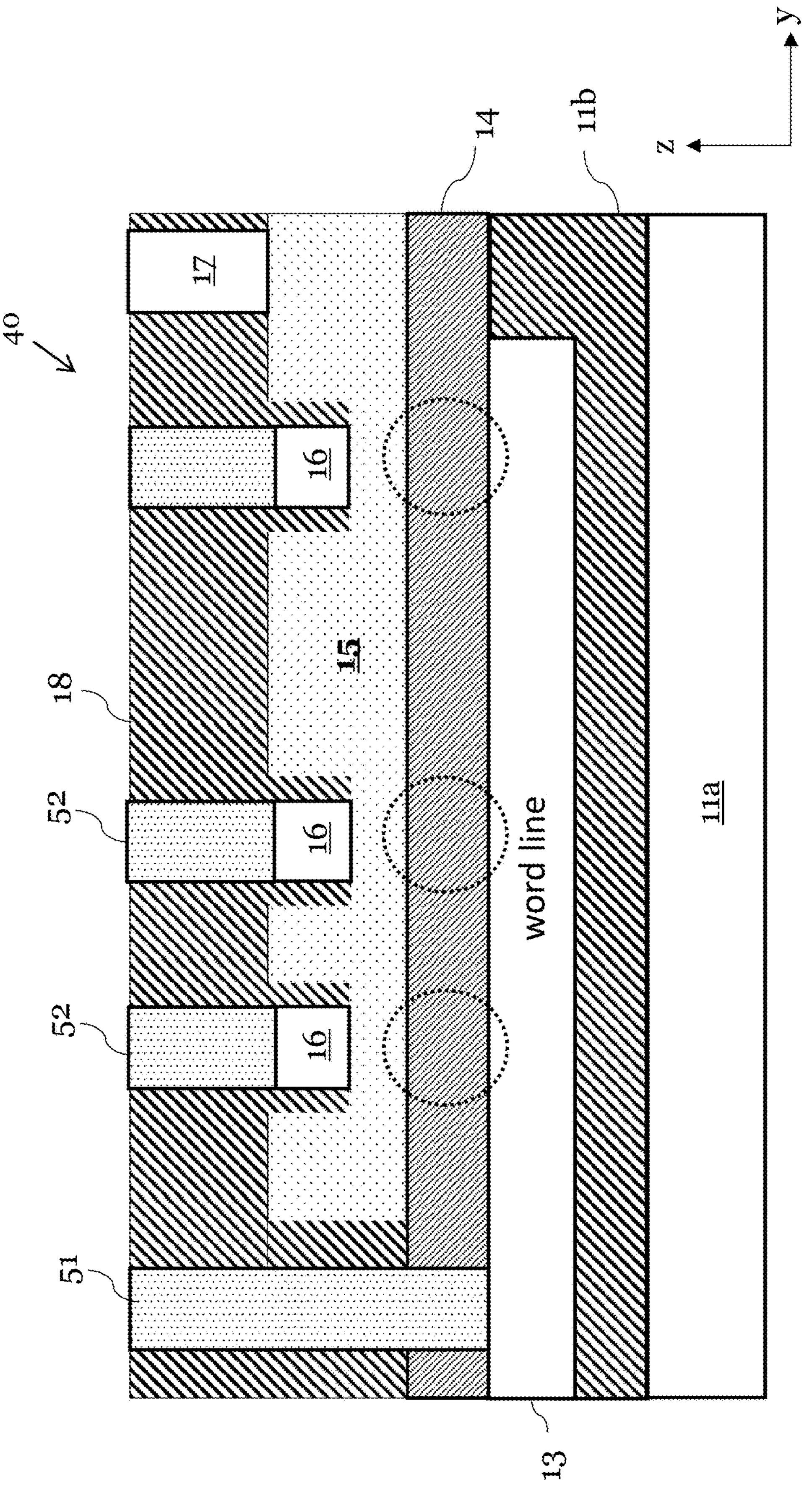
FIG. 5 shows a cross-sectional view of the memory device in FIG. 4 according to one or more embodiments of the disclosed technology.

FIG. 5 shows a cross-sectional view of the memory device 40 in FIG. 4 according to one or more embodiments of the disclosed technology. In some examples, FIG. 5 shows a cross-sectional view along a word line (y-direction), as indicated by the vertical dashed line in FIG. 4.

As shown in FIG. 5, the memory array device 40 may include a gate contact structure 51 which is arranged to establish an electrical contact to the gate metal layer 13 (word line) for applying voltages to the gate metal layer 13. The memory device may further include bit line contacts 52 which electrically connect the source metal structures 16 to the bit line 41.

Both channel conductivity and source contact resistance can be modulated by programming the ferroelectric material layer 14, e.g. a HZO layer. In some examples, the ferroelectric material layer 14 is programmed in the regions below the source metal structures 16 (highlighted by the dashed circles in FIGS. 5 and 6). In this way, more efficient programming can be achieved between source structures 16 and the gate layer 13 due to vertical electric fields in these regions.

Figure 6:
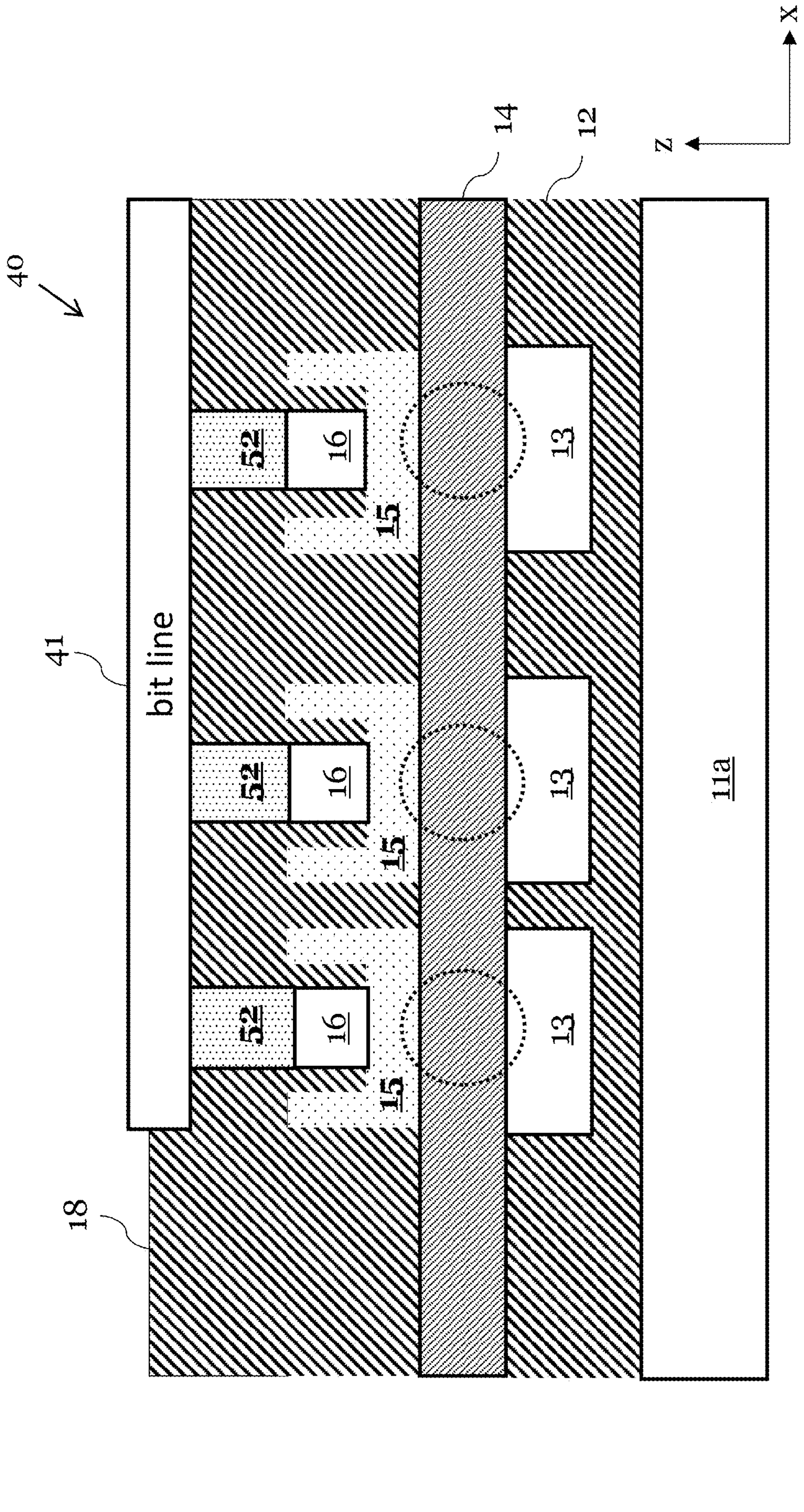
FIG. 6 shows a cross-sectional view of the memory device in FIG. 4 according to one or more embodiments of the disclosed technology.

FIG. 6 shows a cross-sectional view of the memory device 40 in FIG. 4 according to one or more embodiments of the disclosed technology. In some examples, FIG. 6 shows a cross-sectional view along a bit line (x-direction), as indicated by the horizontal dashed line in FIG. 4.

The proposed design of the memory device 40 can have several advantages over conventional FeFET memories: 1) The regions of the ferroelectric layer (e.g., undoped or doped HZO) under the source metal structures 16 can be selectively programmed by applying a programming voltage directly between the bit lines (via source metal structures 16) and word line (gate metal layer 13); this allows for more efficient programming as compared to programming the entire ferroelectric layer or a longer section thereof. 2) The use of a wide bandgap materials, such as oxides, as channel material can prevent the formation of interfacial oxides which allows for lower programming voltages and causes a lower charge trapping and, thus, higher endurance. 3) Both channel and contact resistance can be modulated. 4) The memory device 40 can be used as a random access memory (RAM). 5) A read disturb can be minimized or prevented by using the separate drain metal contacts 17. 6) The wide bandgap semiconductors used for the layer structure 15 can offer a very large variation in the Schottky barrier height. 7) The memory cell does not have to rely on the availability of the minority carriers. Absence of minority carrier can help to increase the contact resistance ratio between a program and an erase state. 8) The drain metal contact 17 can be common for a string. Thus, area efficiency can be improved.

In addition, a memory cell density can be increased by sequential stacking of layers of memory devices 40. All processing steps to fabricate the memory device 40 can have a low enough thermal budget compatible with BEOL (back end of line) processing.

Figure 7:
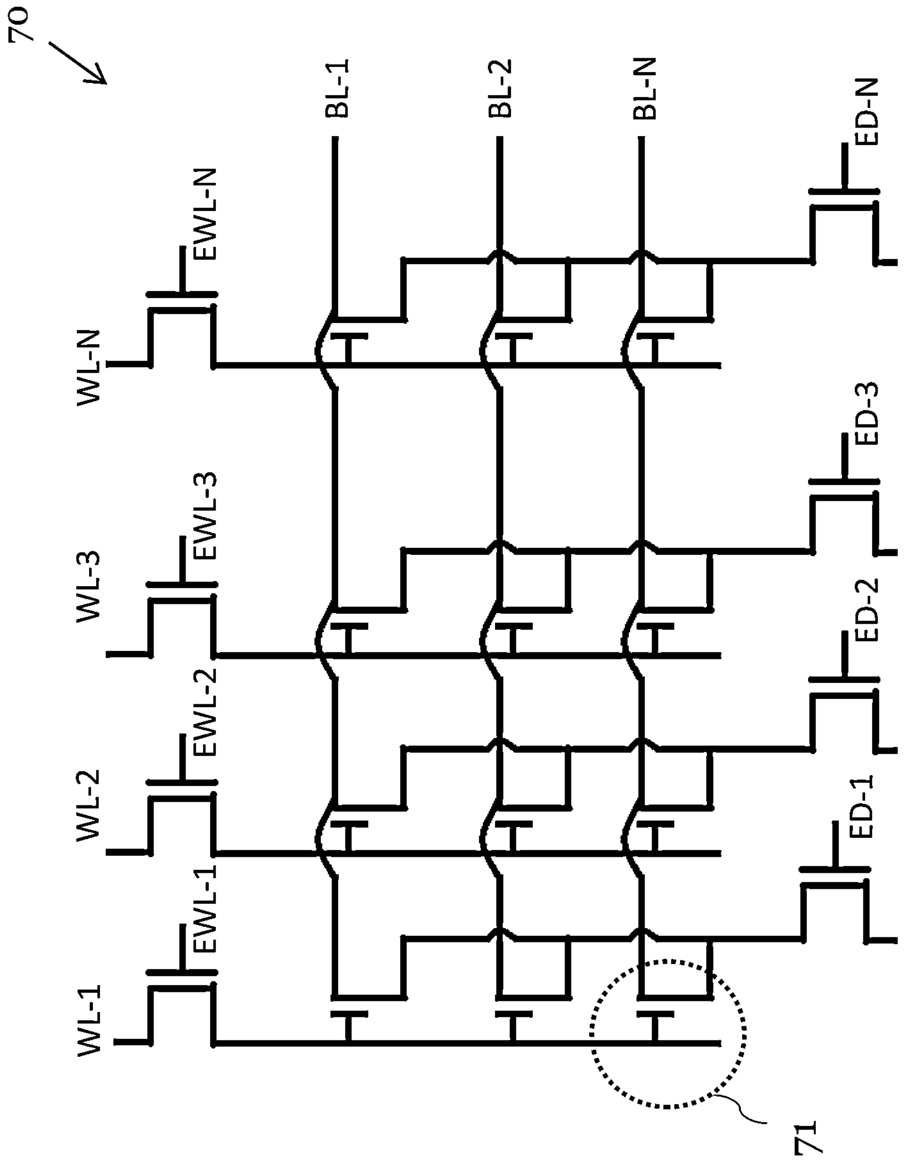
FIG. 7 shows a schematic diagram of a memory device according to one or more embodiments of the disclosed technology.

FIG. 7 shows a schematic diagram of a memory device 70 according to one or more embodiments of the disclosed technology. In some examples, FIG. 7 shows an example of an equivalent circuit of a memory array device 40, as depicted in FIGS. 4-6 with N word lines, N bit lines and N drain lines.

Each word line WL-1 . . . N can include a word line enable gate EWL-1 . . . N, such as a complementary pass transistor (e.g., NMOS+PMOS). Likewise, each drain line Drain-1 . . . N can include a drain line enable gate ED-1 . . . N, such as a complementary pass transistor (e.g., NMOS+PMOS). The word line enable gates EWL-1 . . . N and the drain line enable gates ED-1 . . . N can selectively activate the respective word lines WL-1 . . . N respectively drain lines Drain-1 . . . N.

Each memory cell 71 of the memory array device 70 can include a source metal structure 16 connected to a word line of the memory device and a section of the gate layer 13 below the source metal structure 16 connected to a bit line. The ferroelectric material layer 14 and the layer structure 15 can be arranged between source metal structure 16 and gate layer 13. Each bit line BL-1 . . . N can be further connected to a sense amplifier.

In some examples, the memory array 70 can be operated in two modes: 1) random access, e.g. for non-volatile DRAM; and 2) block erase, e.g. for storage class NVM.

Figure 8:
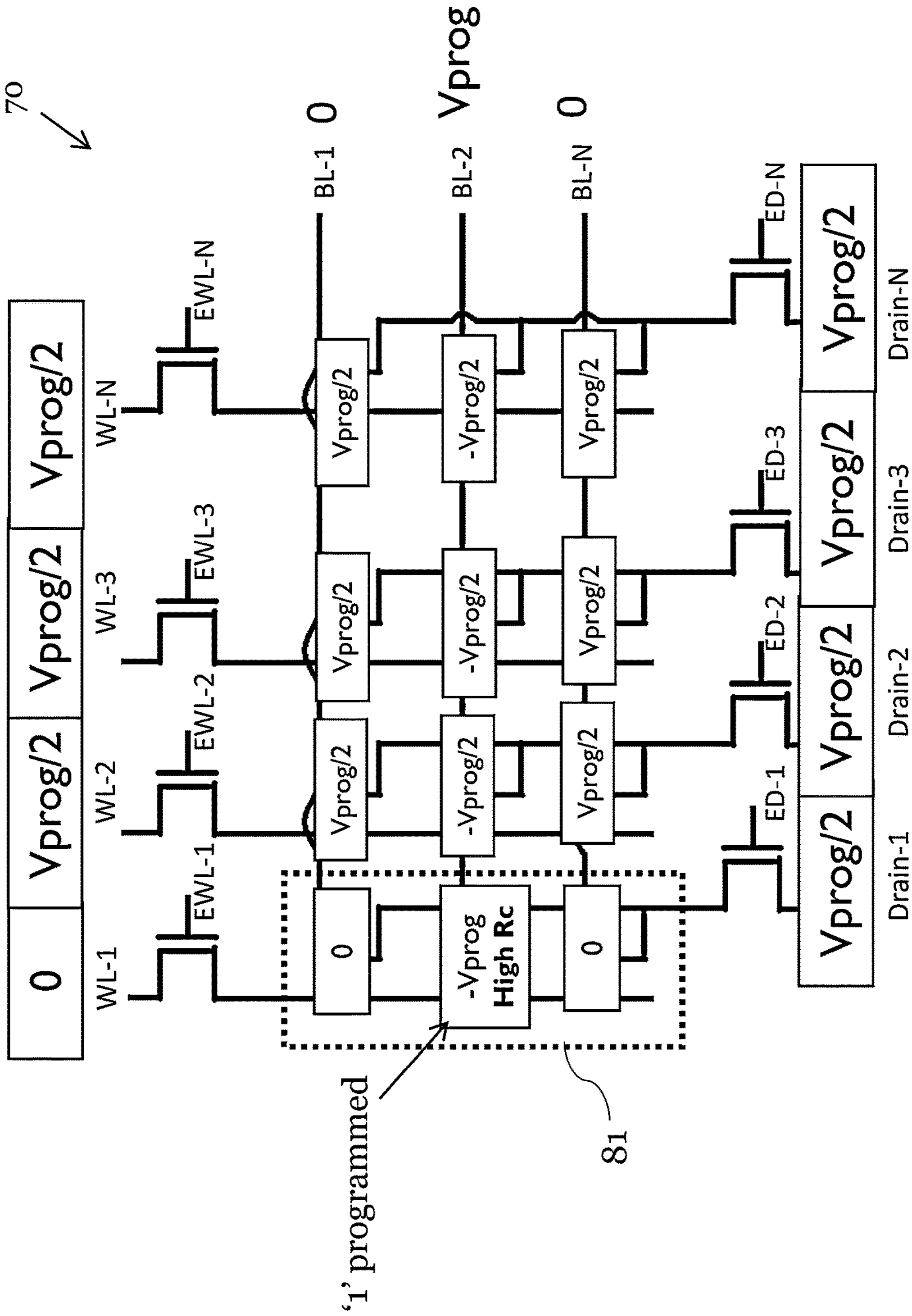
FIG. 8 shows a schematic diagram of a programming of a memory device according to one or more embodiments of the disclosed technology.
Figure 9:
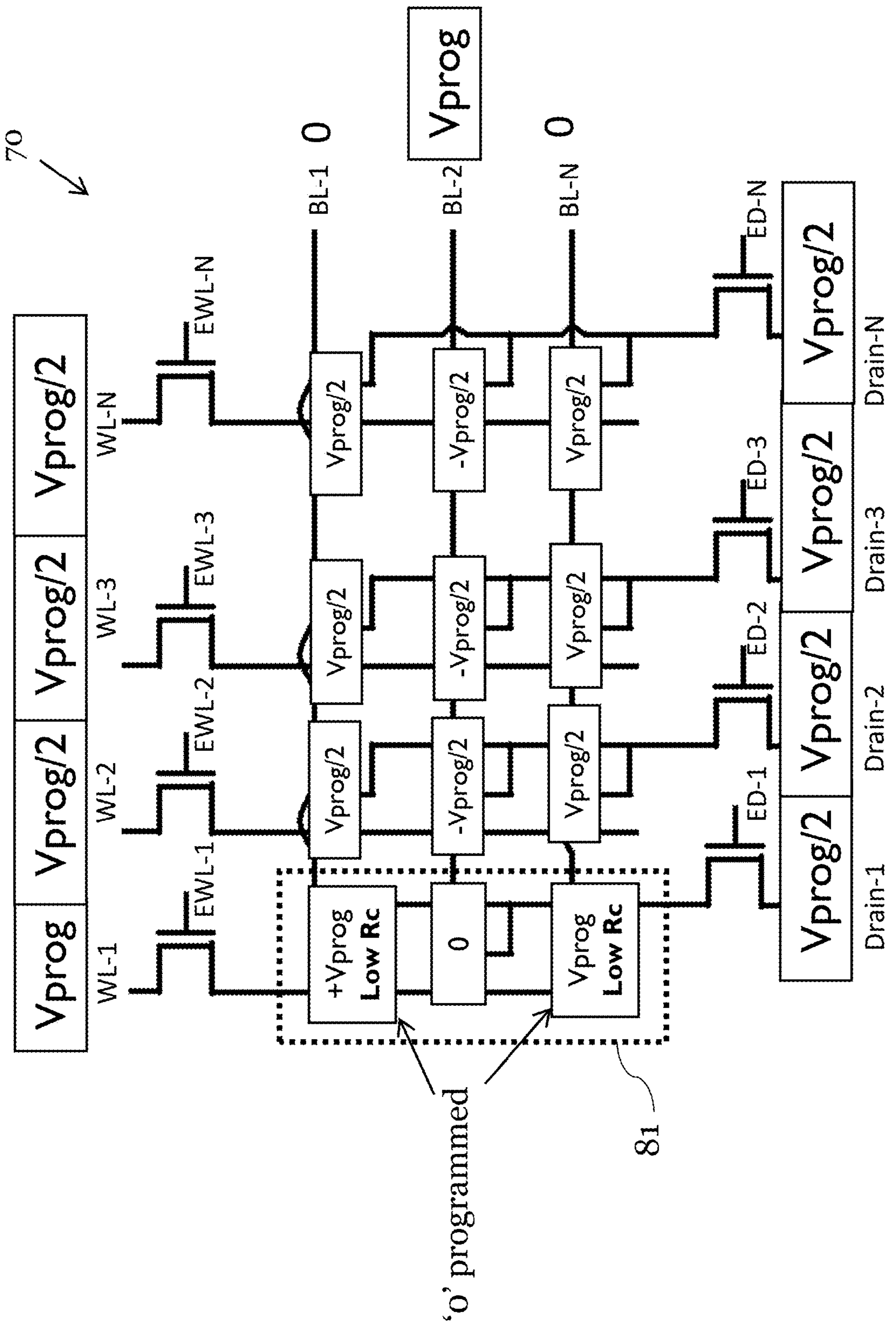
FIG. 9 shows a schematic diagram of a programming of a memory device according to one or more embodiments of the disclosed technology.

FIGS. 8 and 9 show schematic diagram of programming a string 81 of the memory array device 70 according to one or more embodiments of disclosed technology. In some examples, FIGS. 8 and 9 show a random access write operation.

In some examples, the programming of the string 81 can include a two-step operation: In a first step, as shown in FIG. 8, the bit cells with data '1' are written in the selected string 81 (in FIG. 8, the center bit cell of the string 81). In a second step, as shown in FIG. 9, the data '0' is written in the remaining bit cells of the string 81. This scheme can allow for selective write operation.

For example, during writing, all non-selected word lines and all drains are set to $V_{prog}/2$, and each bit line potential is set to either 0 V (to write '0') or $V_{prog}$ (to write '1'). To first program a '1' in the center memory cell of the string 81, the selected WL-1 is set to 0 V (cf., FIG. 8). This will write '1' across all the cells which have '$-V_{prog}$' voltage across the gate and the bit line ($V_{gs}=-V_{prog}$). To subsequently program a '0' in the remaining cells of the string 81, the word line potential of WL-1 is changed to $V_{prog}$ (cf., FIG. 9). This will write '0' into the cells that have '$+V_{prog}$' across the gate and the bit line ($V_{gs}=+V_{prog}$).

Figure 10:
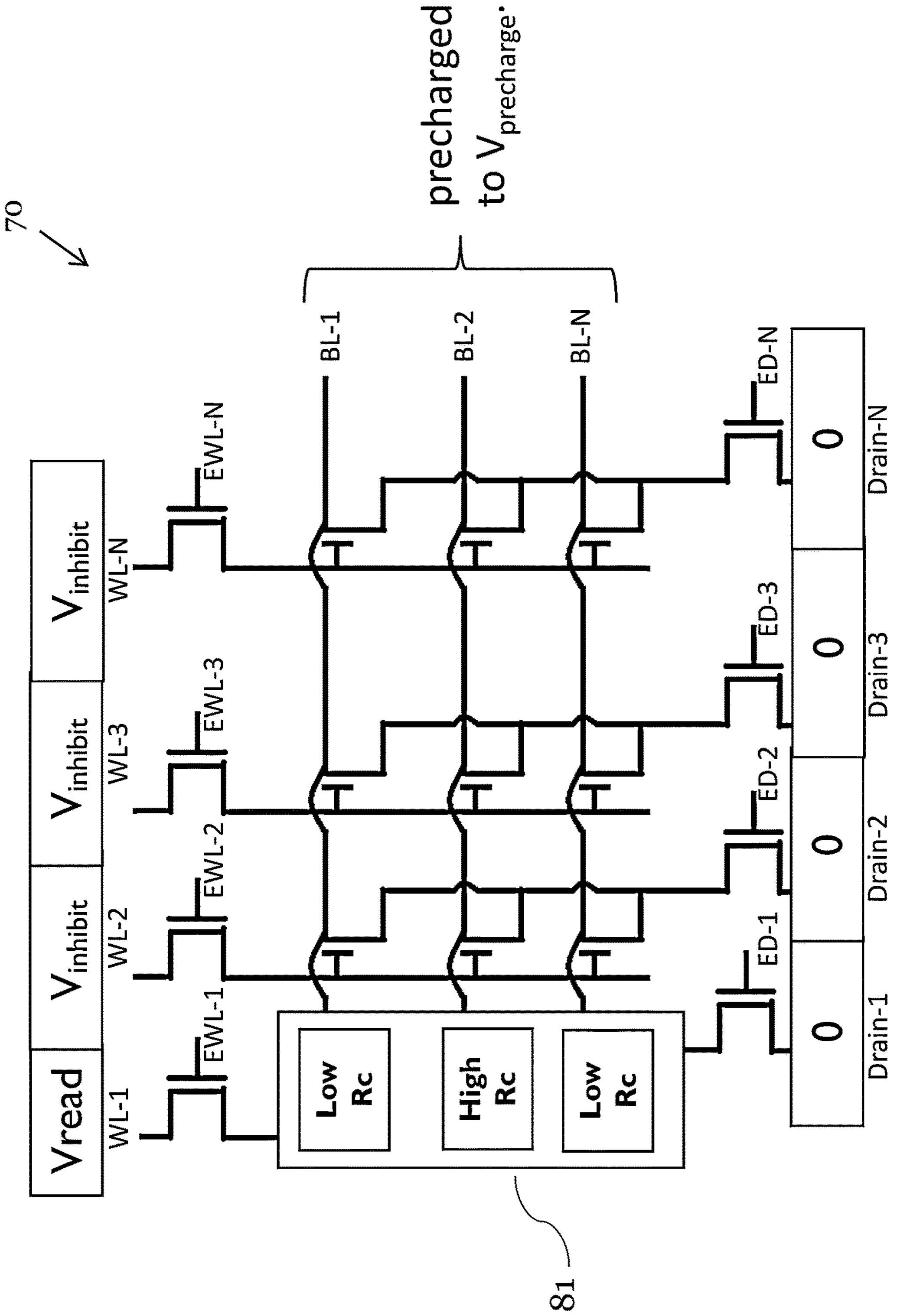
FIG. 10 shows a schematic diagram of a reading-out of a memory device according to one or more embodiments of the disclosed technology.

FIG. 10 shows a schematic diagram of a read-out of the string 81 of the memory array device 70 according to one or more embodiments of the disclosed technology. In some examples, FIG. 10 shows a random access read operation.

The read sequence can include the followings: At first, the bit lines BL-1 . . . N are precharged to a precharge voltage $V_{precharge}$ which is higher than a reference voltage $V_{ref}$ of the sense amplifier. The selected word line voltage of WL-1 is set to $V_{read}$, with $|V_{read}|<|V_{prog}|$. Non-selected WL are set to $V_{inhibit}$. The voltage $V_{inhibit}$ will push the non-selected cells into depletion, thereby suppressing the read disturbance. ($|V_{inhibit}|<|V_{prog}|$). All drain voltages are set to 0 V. In some examples, the non-selected drain lines can be first pre-charged to 0 V and then be disabled through the pass transistors ED-2 . . . N to reduce interference from non-selected cells. The pass transistor ED-1 of the selected drain line can be enabled. The bit lines BL-1 . . . N will discharge through the selected cells of the string 81. In some examples, the rate of the discharging of the bit line capacitor will be governed by an $R_C$ time constant of the contact resistance ($R_c$) of the selected memory cell and the capacitance of the bit line ($C_{BL}$).

In some examples, the cells with lower contact resistance ('0' programmed) will discharge the bit line capacitance faster compared to the cells with higher contact resistance ('1' programmed). The sense amplifier(s) can sample the voltage on the bit lines after a fixed delay. If the voltage on a bit line ($V_{bitline}$) is larger than a reference voltage ($V_{ref}$), then the stored data is '1' else it is '0'.

In some examples, depending on the contact resistance in a memory cell, a higher or lower current will flow through the source contact to the bit line.

Figure 11:
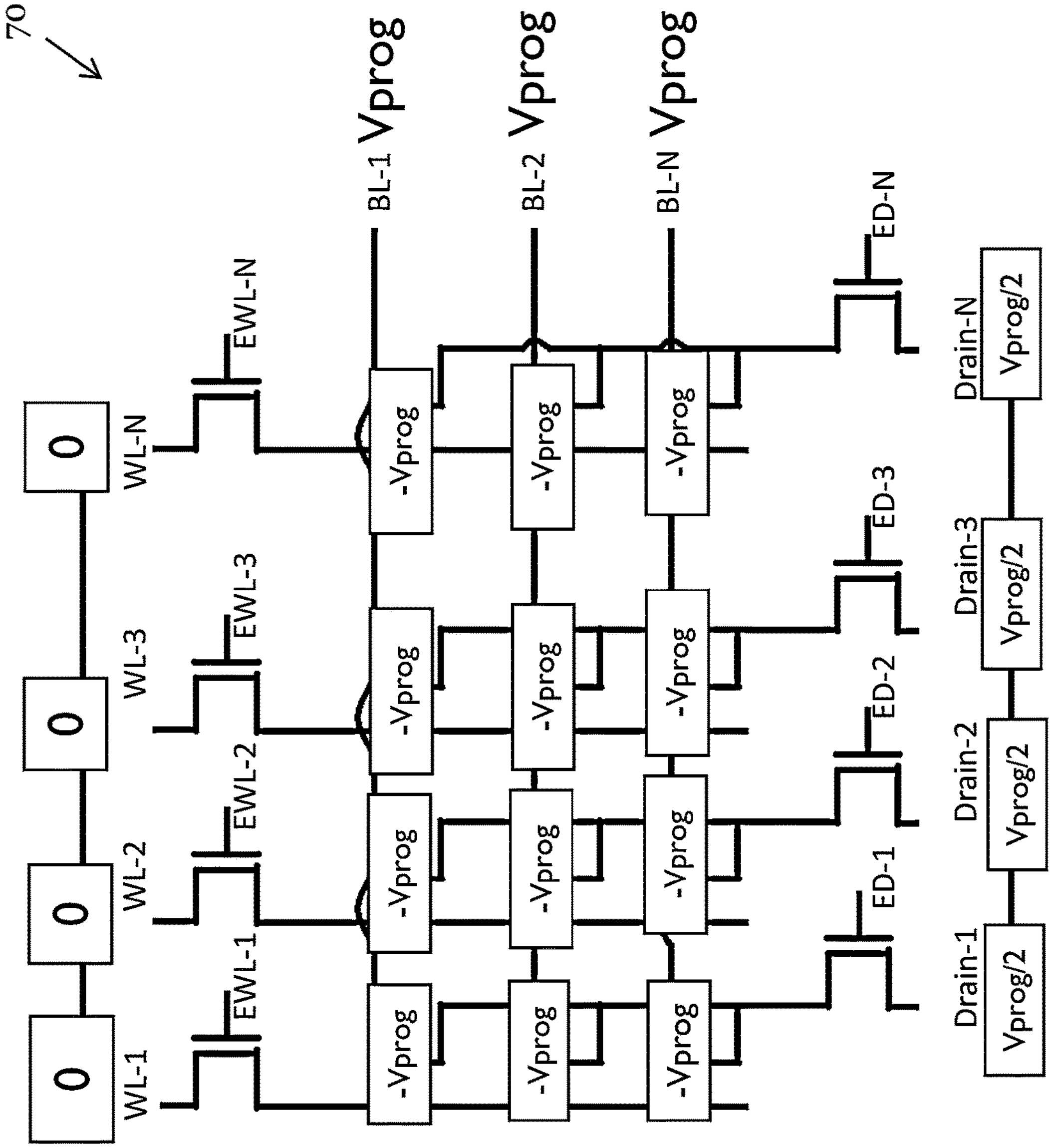
FIG. 11 shows a schematic diagram of a block erase of a memory device according to one or more embodiments of the disclosed technology.

FIG. 11 shows schematic diagram of a block erase of the memory device according to one or more embodiments of disclosed technology.

In some examples, during block erase, all strings of the memory device are selected and a '1' is written into an entire block of memory cells. Therefore, all word lines WL-1 . . . N are set to 0 V, and all bit lines BL-1 . . . N are set to $V_{prog}$. The voltage across the gate and the bit line of all memory cells is set to $-V_{prog}$ ($V_{gs}=-V_{prog}$).

FIGS. 12A-I show steps of a method for fabricating a FeFET memory structure 10 according to one or more embodiments of the disclosed technology. In some examples, the method can be used to fabricate a FeFET memory structure 10, as shown in any one of FIGS. 2-6.

Figure 12B:
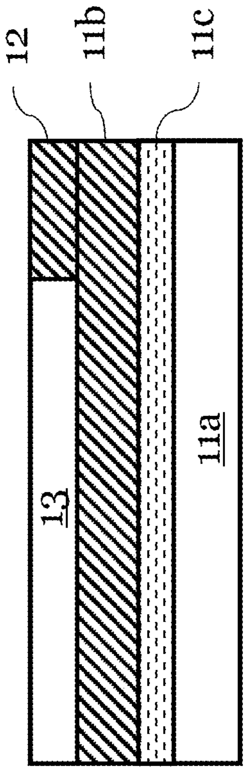
FIGS. 12A-I show steps of a method for fabricating a FeFET memory structure according to one or more embodiments of the disclosed technology.
Figure 12D:
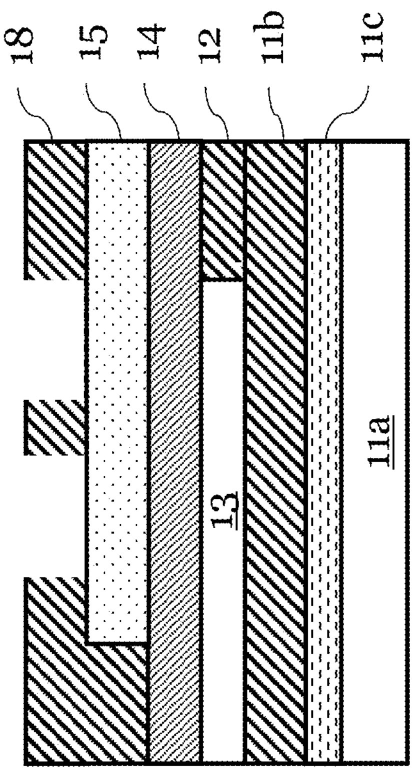
Figure 12A:
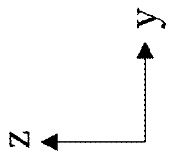
Figure 12A:
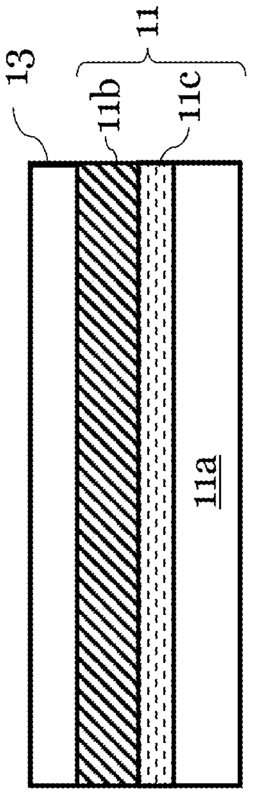

As shown in FIG. 12A, the method can include forming the gate metal layer 13 on the substrate 11. For instance, the gate metal layer 13 can be formed from a word line metal, such as TiN.

The substrate 11 can include an insulating layer 11*b*. In some examples, the gate metal layer 13 is formed on the insulating layer 11*b*. The substrate 11 may further include a base layer or base substrate 11*a*, e.g., a silicon wafer or a part thereof. The insulator layer 11*b* can be an oxide, e.g. a silicon oxide, and can be deposited on the base layer 11*a*.

The substrate 11 can further include a FEOL layer 11*c*. The FEOL layer 11*c* can include a control circuitry for memory operation, which is, e.g., first fabricated on the base layer 11*a*. This can allow integration the FeFET memory structure 10 in a BEOL (back end of line) stack as all processes can be compatible to a BEOL thermal budget.

In a second step, shown in FIG. 12B, the gate metal layer 13 can be selectively removed in a region that will be below the drain metal structure 17. A further oxide layer 12 can be formed on the insulator layer 11*b* in regions where the gate metal layer 13 was removed. The insulator layer 11*b* and the further oxide layer 12 can be formed from the same material. Selectively removing the back gate in this way can prevent a high parasitic capacitance and, thus, can make the memory structure 10 more energy efficiency.

Figure 12C:
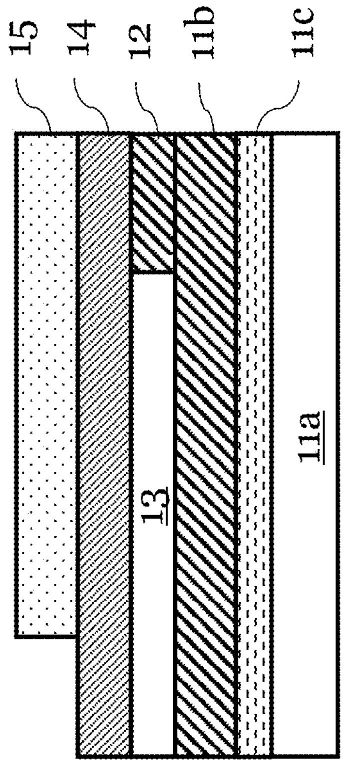

In a further step, shown in FIG. 12C, the at least one ferroelectric material layer 14 is formed on the gate metal layer 13. Furthermore, at least one wide bandgap semiconductor layer of the layer structure 15 is formed on the ferroelectric material layer 14.

In some examples, the at least one wide bandgap semiconductor layer is formed with a uniform height, the uniform height being the first height The ferroelectric material layer can be La doped HZO. The wide bandgap semiconductor layer can include an IGZO layer and can form a channel. An optional annealing step in an $O_2$ ambient can be carried out to modulate the conductivity of the channel (in case of an IGZO channel).

Figure 12E:
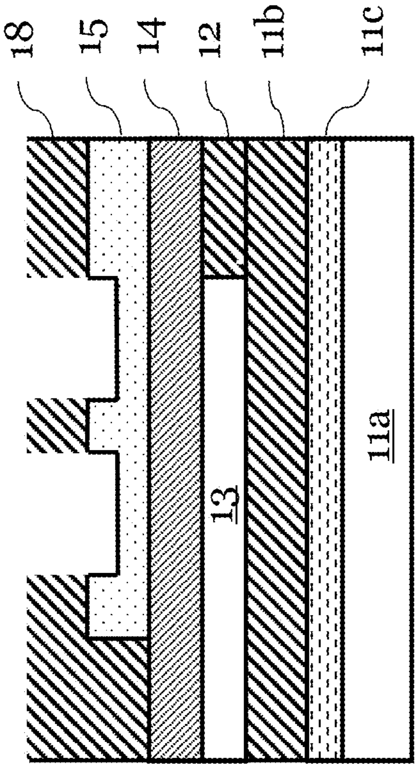

The layer structure can then be further processed by locally reducing the uniform height of the at least one wide bandgap semiconductor layer to the second height to form the at least one second section, as shown in FIGS. 12D and 12E. To structure the layer structure 15 in this way, an isolating dielectric 18 or other suitable auxiliary layer can be deposited on the layer structure 15 and can be patterned to open windows for thinning down the layer structure 15 (cf., FIG. 12D), e.g. by means of suitable lithographic and/or etching steps. Subsequently, the layer structure 15 itself can be selectively thinned down to form the second sections 15-2 with reduced height (cf., FIG. 12E), e.g. by means of etching. The isolating dielectric layer 18 can be an oxide layer.

In some embodiments, the layer structure 15 can include multiple wide bandgap semiconductor layers 15*a*, 15*b* which are arranged in the form of a layer stack, as schematically depicted in FIG. 3. These layers 15*a*, 15*b* can be selectively deposited on top of each other to form the first and second sections of the layer structure 15.

For instance, the first section of the layer structure 15 has a height between 10 and 30 nm, in some examples between 15 and 25 nm, and the at least one second section of the layer structure 15 has a height between 2 and 8 nm, in some examples between 3 and 5 nm.

Figure 12F:
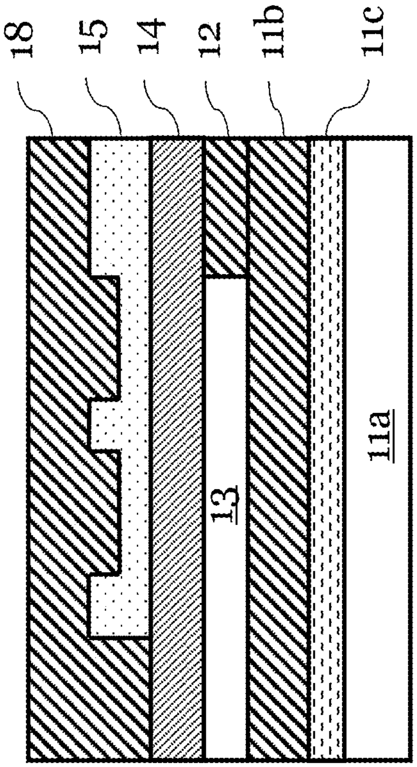
Figure 12G:
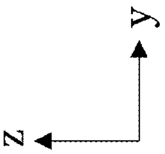
Figure 12G:
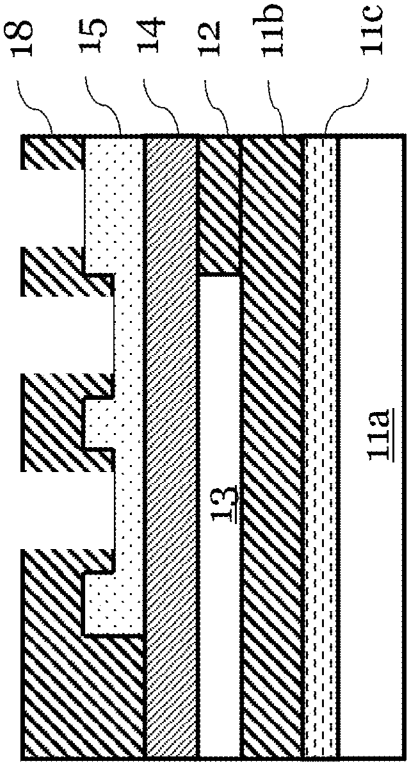

In subsequent steps, shown in FIGS. 12F to 12G, the drain metal structure 17 is formed on the first section of the layer structure 15, and the one or more source metal structures 16 are formed on respective second sections of the layer structure 15.

Therefore, the windows in the isolating dielectric 18 can be filled by depositing an additional isolation dielectric (cf., FIG. 12F). A chemical mechanical polishing (CMP) can subsequently be performed on the layer 18.

Figure 12H:
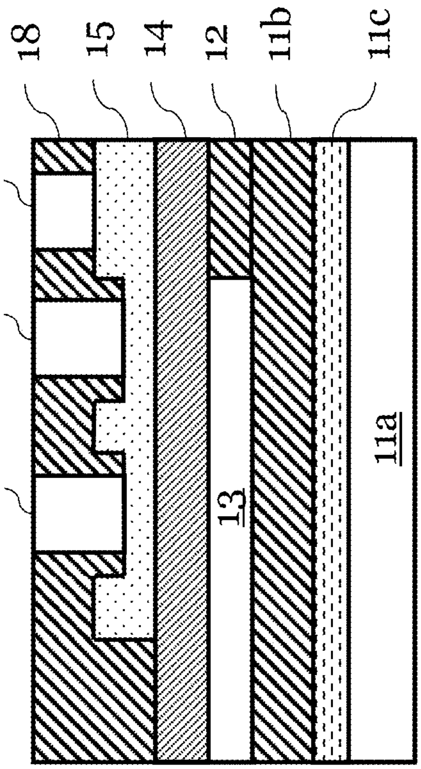

Subsequently, new windows can be opened in the layer 18 (cf., FIG. 12G), e.g. by means of a suitable lithographic technique, and the windows can be filled with source respectively drain metals (cf., FIG. 12H). A subsequent CMP step and/or annealing step to modify the conductivity of the IGZO layer can be carried out.

Figure 12I:
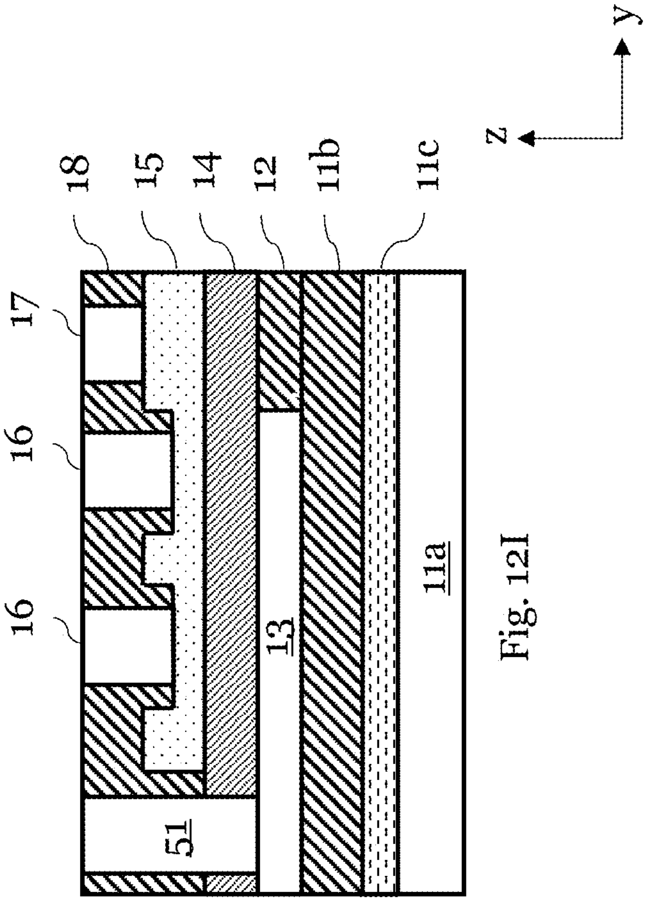

In a further step, shown in FIG. 12I, a gate contact structure 51 can be formed on the gate metal layer 13, wherein the gate contact structure 51 passes through a gap in the at least one ferroelectric material layer 14. For instance, the gate contact structure 51 is formed. by etching a window in the isolating dielectric 18 and the ferroelectric material layer 14 and filling said window with a metal.

In the claims as well as in the description of disclosed technology, the word "comprising" does not exclude other elements or steps and the indefinite article "a" or "an" does not exclude a plurality. A single element may fulfill the functions of several entities or items recited in the claims. The mere fact that certain measures are recited in the mutual different dependent claims does not indicate that a combination of these measures cannot be used in an advantageous implementation.

What is claimed is:

1. A ferroelectric field-effect transistor (FeFET) memory structure, comprising:
- a substrate comprising an insulator layer;
- a gate metal layer on the insulator layer;
- at least one ferroelectric material layer on the gate metal layer;
- a layer structure comprising at least one wide bandgap semiconductor layer on the at least one ferroelectric material layer, wherein the layer structure further comprises:
  - a first section having a first height, and
  - at least one second section having a second height that is smaller than the first height;
- a drain metal structure on the first section of the layer structure; and
- one or more source metal structures each arranged on a respective second section of the layer structure.

2. The FeFET memory structure of claim 1, wherein the first section of the layer structure has a height between 10 nm and 30 nm.

3. The FeFET memory structure of claim 1, wherein the first section of the layer structure has a height between 15 nm and 25 nm.

4. The FeFET memory structure of claim 1, wherein the at least one second section of the layer structure has a height between 2 nm and 8 nm.

5. The FeFET memory structure of claim 1, wherein the at least one second section of the layer structure has a height between 3 nm and 5 nm.

6. The FeFET memory structure of claim 1, wherein the layer structure comprises one or more of:
- indium gallium zinc oxide;
- indium tin oxide;
- indium zinc oxide;
- tungsten oxide;
- zinc oxide;
- indium oxide;
- tin oxide;
- magnesium zinc oxide;
- Mg- and Al-doped ZnO; and
- gallium zinc oxide.

7. The FeFET memory structure of claim 1, wherein the at least one ferroelectric material layer comprises:
- a doped or undoped hafnium-zirconium oxide (HZO);
- a doped hafnium oxide;
- an oxide having a perovskite structure; or
- a ferroelectric material having a wurtzite structure.

8. The FeFET memory structure of claim 7, wherein the at least one ferroelectric material layer comprises a lanthanum-doped HZO.

9. The FeFET memory structure of claim 7, wherein the at least one ferroelectric material layer comprises the oxide having the perovskite structure selected from the group consisting of SrBiTaO, PbZrTiO, BiFeO and BiTiO—BaTiO.

10. The FeFET memory structure of claim 7, wherein the at least one ferroelectric material layer comprises AlScN or MgZnO.

11. The FeFET memory structure of claim 1, wherein material of the gate metal layer comprises one or more of:

titanium nitride;

tungsten;

aluminum;

molybdenum;

doped polycrystalline silicon;

doped germanium;

platinum; and ruthenium.

12. The FeFET memory structure of claim 1, wherein the layer structure comprises a plurality of second sections which are separated from each other and arranged along a line, and wherein a respective source metal structure is arranged on each of the plurality of second sections.

13. The FeFET memory structure of claim 1, further comprising:

a gate contact structure arranged on the gate metal layer, wherein the gate contact structure is configured to apply a voltage to the gate metal layer.

14. A memory device, the memory device comprising:

a plurality of FeFET memory structures each according to claim 1; and one or more bit line structures, wherein each bit line structure is in contact with one source metal structure of each of the plurality of FeFET memory structures, and wherein each bit line structure is configured to apply a voltage to the source metal structures in contact therewith.

15. A method of fabricating a ferroelectric field-effect transistor (FeFET) memory structure, the method comprising:

forming a gate metal layer on a substrate comprising an insulating layer;

forming at least one ferroelectric material layer on the gate metal layer;

forming a layer structure comprising at least one wide bandgap semiconductor layer on the at least one ferroelectric material layer, wherein the layer structure further comprises:

a first section having a first height; and at least one second section having a second height that is smaller than the first height;

forming a drain metal structure arranged on the first section of the layer structure; and forming one or more source metal structures wherein each source metal structure is arranged on a respective second section of the layer structure.

16. The method of claim 15, wherein forming the layer structure comprises:

forming the at least one wide bandgap semiconductor layer on the at least one ferroelectric material layer with a uniform height, the uniform height being the first height; and locally reducing the uniform height of the at least one wide bandgap semiconductor layer to the second height to form the at least one second section.

17. The method of claim 15, wherein the first section of the layer structure has a height between 10 nm and 30 nm.

18. The method of claim 15, wherein the at least one second section of the layer structure has a height between 2 nm and 8 nm.

19. The method of claim 15, wherein the at least one second section of the layer structure has a height between 3 nm and 5 nm.

20. The method of claim 15, wherein the gate metal layer is removed in a region below the drain metal structure prior to forming the at least one ferroelectric material layer.

21. The method of claim 15, further comprising:

forming a gate contact structure on the gate metal layer, wherein the gate contact structure passes through a gap in the at least one ferroelectric material layer.

* * * * *